(12) United States Patent
Xu et al.

(10) Patent No.: US 11,942,486 B2
(45) Date of Patent: Mar. 26, 2024

(54) DISPLAY PANEL WITH TWO DATA LINES ARRANGED OPPOSITE TO EACH OTHER IN DISPLAY AREA OF SUB-PIXEL, AND DISPLAY DEVICE INCLUDING SAME

(71) Applicant: Shenzhen China Star Optoelectronics Semiconductor Display Technology Co., Ltd., Guangdong (CN)

(72) Inventors: Sen Xu, Guangdong (CN); Bangqing Xiao, Guangdong (CN); Hua Fu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 628 days.

(21) Appl. No.: 17/260,243

(22) PCT Filed: Dec. 21, 2020

(86) PCT No.: PCT/CN2020/137962
§ 371 (c)(1),
(2) Date: Jan. 14, 2021

(87) PCT Pub. No.: WO2022/116301
PCT Pub. Date: Jun. 9, 2022

(65) Prior Publication Data
US 2022/0406816 A1    Dec. 22, 2022

(30) Foreign Application Priority Data
Dec. 2, 2020 (CN) .......................... 202011401245.7

(51) Int. Cl.
*H01L 27/12* (2006.01)

(52) U.S. Cl.
CPC .................................. *H01L 27/124* (2013.01)

(58) Field of Classification Search
CPC ............ H01L 27/124; G02F 1/136286; G02F 1/134363
See application file for complete search history.

(56) References Cited

U.S. PATENT DOCUMENTS

2015/0021708 A1    1/2015 Lin et al.

FOREIGN PATENT DOCUMENTS

| CN | 103018988 | 4/2013 |
|---|---|---|
| CN | 104252068 | 12/2014 |
| CN | 106205515 | 12/2016 |
| CN | 106886112 | 6/2017 |
| CN | 110320719 | 10/2019 |
| CN | 110503918 | 11/2019 |

*Primary Examiner* — Joseph L Williams (57) ABSTRACT

The present invention provides a display panel. By changing a wiring mode of data lines of a sub-pixel, a non-display area of a first sub-pixel is provided with a data line branched in the display area, and a display area of the first sub-pixel is further provided with a second data line, such that by setting opposite signals of the first data line and the second data line, the coupling voltages of the two data line signals to the sub-pixels can be offset by each other, and the problem of vertical crosstalk of an ultra-narrow border display is improved.

20 Claims, 7 Drawing Sheets

DISPLAY PANEL WITH TWO DATA LINES ARRANGED OPPOSITE TO EACH OTHER IN DISPLAY AREA OF SUB-PIXEL, AND DISPLAY DEVICE INCLUDING SAME

RELATED APPLICATIONS

This application is a National Phase of PCT Patent Application No. PCT/CN2020/137962 having International filing date of Dec. 21, 2020, which claims the benefit of priority of Chinese Patent Application No. 202011401245.7 filed on Dec. 2, 2020. The contents of the above applications are all incorporated by reference as if fully set forth herein in their entirety.

FIELD AND BACKGROUND OF THE INVENTION

The present invention relates to the field of display technology, and in particular to a display panel.

An ultra-narrow border liquid crystal display, which is herein referred to as a gate driver in source (COF) is a new design of a panel, in which the scan line and data line driving signals are output from a same side of a chip on film (COF), and there is no gate on array (GOA) stage transfer circuit on the left and right sides of the panel. Therefore, adopting this design method can reduce borders on the left and right sides, and realize narrow border visual experience of "three narrow and one wide" borders. In a sub-pixel design of the ultra-narrow border liquid crystal display, due to a parasitic capacitance between a data line and a sub-pixel, a change of a data line signal will interfere with a sub-pixel signal, which will cause poor display of vertical crosstalk.

Figure 1:
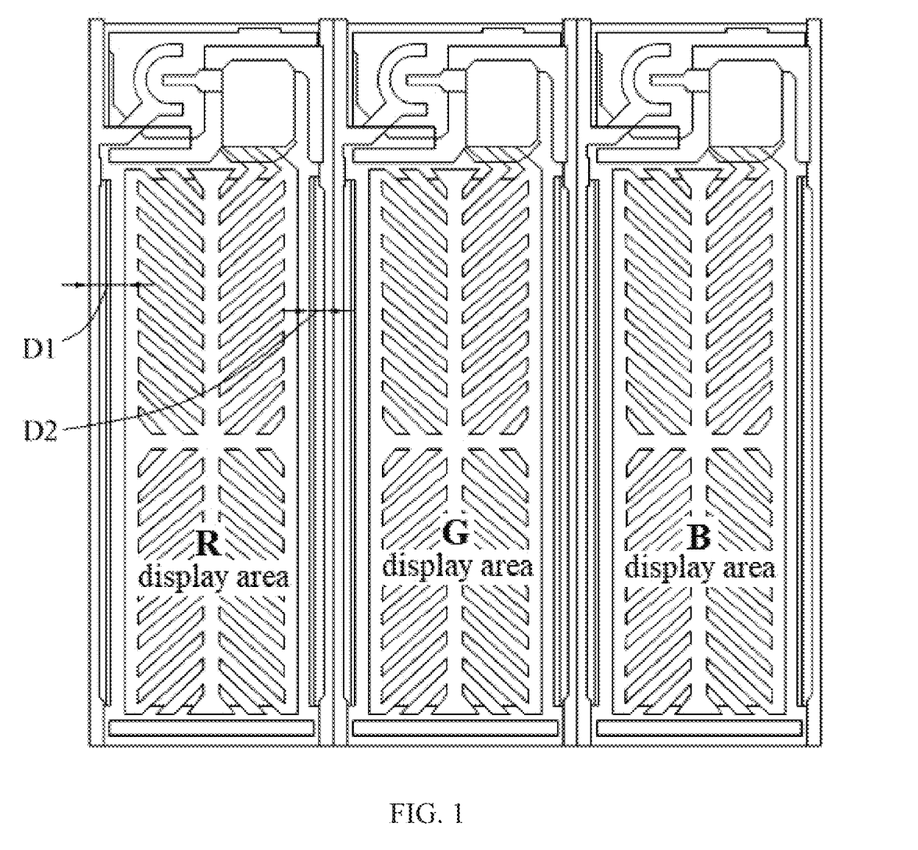
FIG. 1 is a schematic diagram of a first pixel structure in the prior art.
Figure 2:
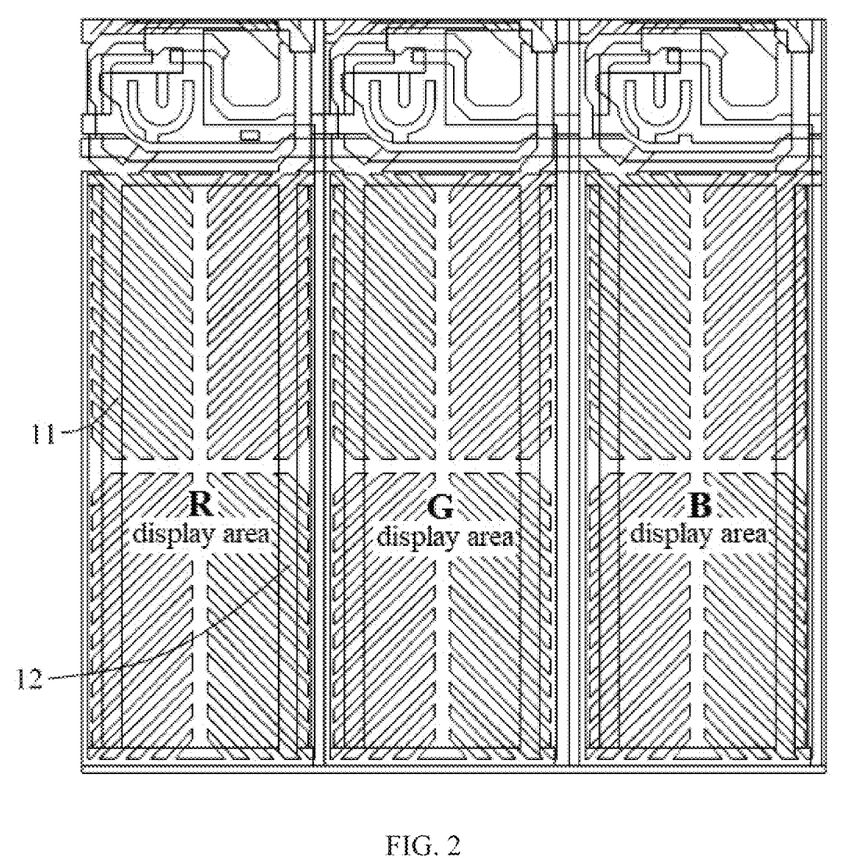
FIG. 2 is a schematic diagram of a second pixel structure in the prior art.

In an ordinary design of sub-pixels, there will also be display failures due to vertical crosstalk. As shown in FIG. 1, distances between the data lines on the left and right sides of any sub-pixel and the sub-pixel display area are same as each other (D1=D2); and if the signals of the two data lines are opposite, one of them has a positive coupling voltage, and another one of them has a negative coupling voltage, which thus can be offset by each other. As shown in FIG. 2, the existing product has another design architecture, wherein two data lines are used in the display area of the sub-pixel, that is, each of the sub-pixels has two data lines (11 and 12), and the two data lines has opposite signals, such that the coupling voltage of the data lines to the pixel can be cancelled.

Figure 3:
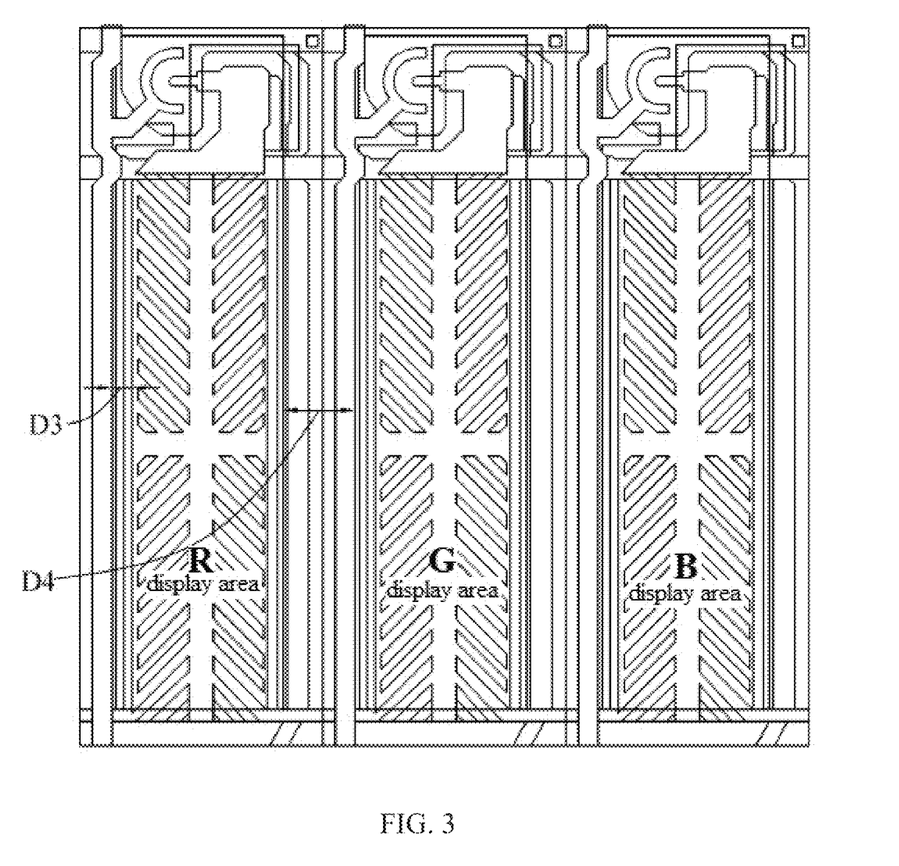
FIG. 3 is a schematic diagram of a third pixel structure in the prior art.
Figure 4:
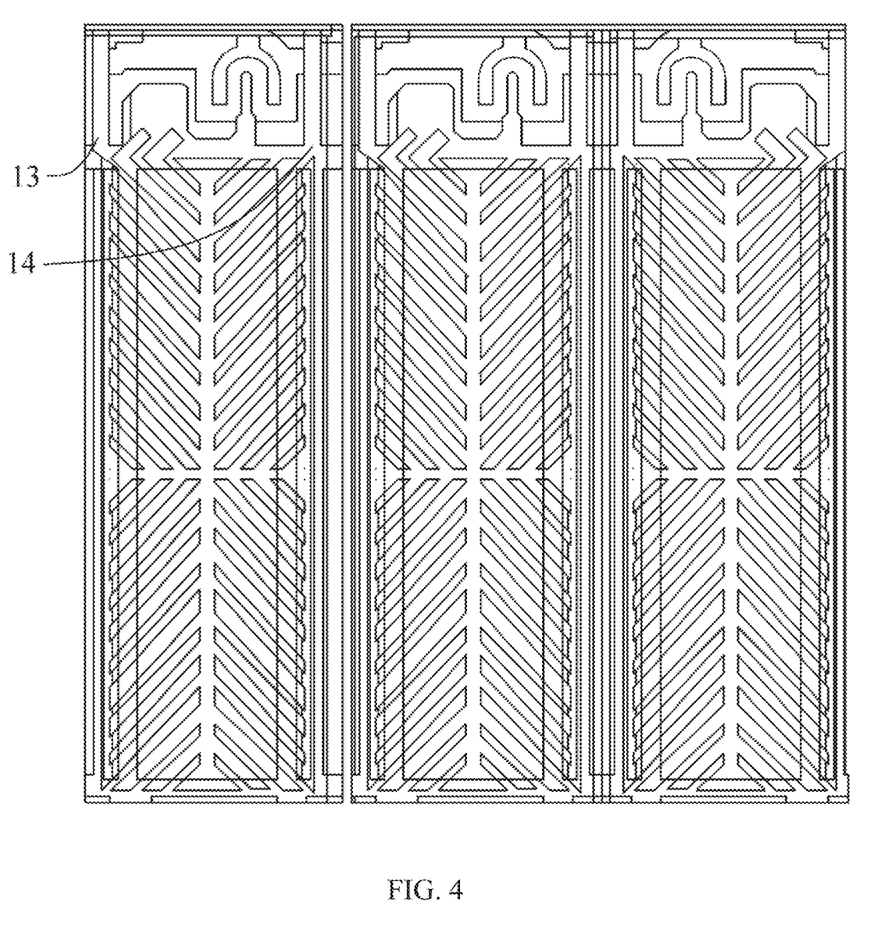
FIG. 4 is a schematic diagram of a fourth pixel structure in the prior art.

As shown in FIG. 3, in the ultra-narrow border design, since the vertical wiring of the scan line will pass through the sub-pixel, if the architecture of FIG. 1 is used, the distances between the data lines on the left and right sides of the sub-pixel and the sub-pixel display area will be different (D3<D4) from each other, causing different parasitic coupling capacitances of the data lines and the sub-pixel and even if the signals of the data lines are opposite, the generated coupling voltage cannot be completely offset. Therefore, there is still a risk of vertical crosstalk in the ultra-narrow border liquid crystal display (LCD). Further, if the architecture of FIG. 2 is used, as shown in FIG. 4, an increased number of data lines (13 and 14) will be caused, resulting in an increased number of chips on film (COFs), thereby increasing production costs.

Therefore, there is a need to provide a display panel to solve the problem of relatively wide border in the prior art.

SUMMARY OF THE INVENTION

An object of the present invention is to provide a display panel, which solves the problem of vertical crosstalk while realizing a narrow border of the display panel, and reducing the number of chips on film (COFs) by reducing the number of wirings.

The present invention provides a display panel, which includes a plurality of sub-pixel groups disposed in an array, wherein each of the sub-pixel groups includes a first sub-pixel; and the first sub-pixel includes: a common electrode wiring enclosing a rectangle area to serve as a display area of the first sub-pixel; a first data line disposed above the common electrode wiring, wherein the first data line extends from a non-display area of the first sub-pixel and passes through the display area; and a second data line disposed above the common electrode wiring, wherein the second data line is disposed in the display area of the first sub-pixel and opposite to the first data line, wherein, the first data line and the second data line are insulated from each other and do not intersect each other, and electrical signals of the first data line and the second data line are opposite.

Further, the first data line and the second data line in the display area are bilaterally symmetrical with respect to a center line of the first sub-pixel.

Further, the first data line includes a trunk disposed in the non-display area and a first branch disposed in the display area, and the first branch is connected to the trunk; and the second data line includes a second branch disposed in the display area, and the second branch and the first branch are bilaterally symmetrical with respect to a center line of the first sub-pixel.

Further, each of the first branch and the second branch includes: a vertical portion; an upper horizontal portion connected to one end of the vertical portion; and a lower horizontal portion connected to an opposite end of the vertical portion.

Further, each of the sub-pixel groups further includes a second sub-pixel, the second sub-pixel is a sub-pixel in a row adjacent to the first sub-pixel, and the second sub-pixel has a same structure as the first sub-pixel.

Further, the first data line of the second sub-pixel and the second data line of the first sub-pixel share one trunk.

Further, a lateral portion of the first data line of the second sub-pixel and a lateral portion of the second data line of the first sub-pixel are connected to the trunk of the first data line of the second sub-pixel.

Further, the first sub-pixel further includes: a horizontal scan line disposed in the non-display area; a vertical scan line disposed between the first sub-pixel and the second sub-pixel and connected to the horizontal scan line; and a pixel electrode disposed above the display area.

Further, the horizontal scan line is formed in a first metal layer; the vertical scan line is formed in a second metal layer, and the second metal layer is insulated from the first metal layer; and the horizontal scan line is connected to the vertical scan line through a via hole.

Further, the first sub-pixel further includes a thin film transistor disposed in the non-display area, wherein the thin film transistor includes: a gate; and a source and a drain disposed above the gate.

The present invention provides a display panel. By changing the wiring mode of the data lines of the sub-pixel, the non-display area of the first sub-pixel is provided with a data line branched in the display area, and the display area of the first sub-pixel is further provided with a second data line, such that by setting opposite signals of the first data line and the second data line, the coupling voltages of the two data line signals to the sub-pixels can be offset by each other, and the problem of vertical crosstalk of the ultra-narrow border is improved.

Moreover, the second data line branch of the present invention and the first data line branch of the second sub-pixel share the trunk of the non-display area of the second sub-pixel, and while realizing the function of the pixel structure in FIG. 3, since the non-display area only has one data line, the number of the chips on film (COFs) used can be reduced, thereby reducing production costs.

BRIEF DESCRIPTION OF THE SEVERAL VIEWS OF THE DRAWINGS

The technical solutions and other beneficial effects of the present application will be made obvious by describing in detail the specific implementations of the present application in conjunction with the accompanying drawings.

Elements of the prior art in the drawings are designated by reference numerals listed below.

first sub-pixel 110; second sub-pixel 120; common electrode wiring 111;
first data line 112; second data line 1124; horizontal scan line 117;
vertical scan line 118; pixel electrode 119; non-display area 102;
display area 101; vertical portion 1121;
upper lateral portion 1122 of first electrode branch;
via hole 112; substrate 201; first metal layer 202;
first insulating layer 203; second metal layer 204; third metal layer 205;
passivation layer 206; color resist layer 207; second insulating layer 208;
first branch 200; lateral portion 1123 of first electrode branch;
active layer 302; gate insulating layer 303; gate 304;
first insulating layer 203; second metal layer 204; second insulating layer 208;
source/drain metal layer 308.

DESCRIPTION OF SPECIFIC EMBODIMENTS OF THE INVENTION

The following disclosure provides many different embodiments, or examples, for implementing different features of the invention. Specific examples of components and arrangements are described below to simplify the present disclosure. These are, of course, merely examples and are not intended to limit the invention.

In the description of the present invention, it is to be understood that the terms "center", "lateral", "upper", "lower", "left", "right", "vertical", "horizontal", "top", "bottom", "inside", "outside" and the like are based on the orientation or positional relationship shown in the drawings, and is merely for the convenience of describing the present invention and simplifying the description, and does not indicate or imply that the indicated devices or components must to be in particular orientations, or constructed and operated in a particular orientation, and thus are not to be construed as limiting the invention. Furthermore, the terms "first", "second", etc. in the specification and claims of the present invention and the above figures are used to distinguish similar objects, and are not necessarily used to describe a specific order or prioritization. It should be understood that the objects so described are interchangeable when it is appropriate. Moreover, the terms "including" and "having" and any variations thereof are intended to cover a non-exclusive "inclusion".

Figure 5:
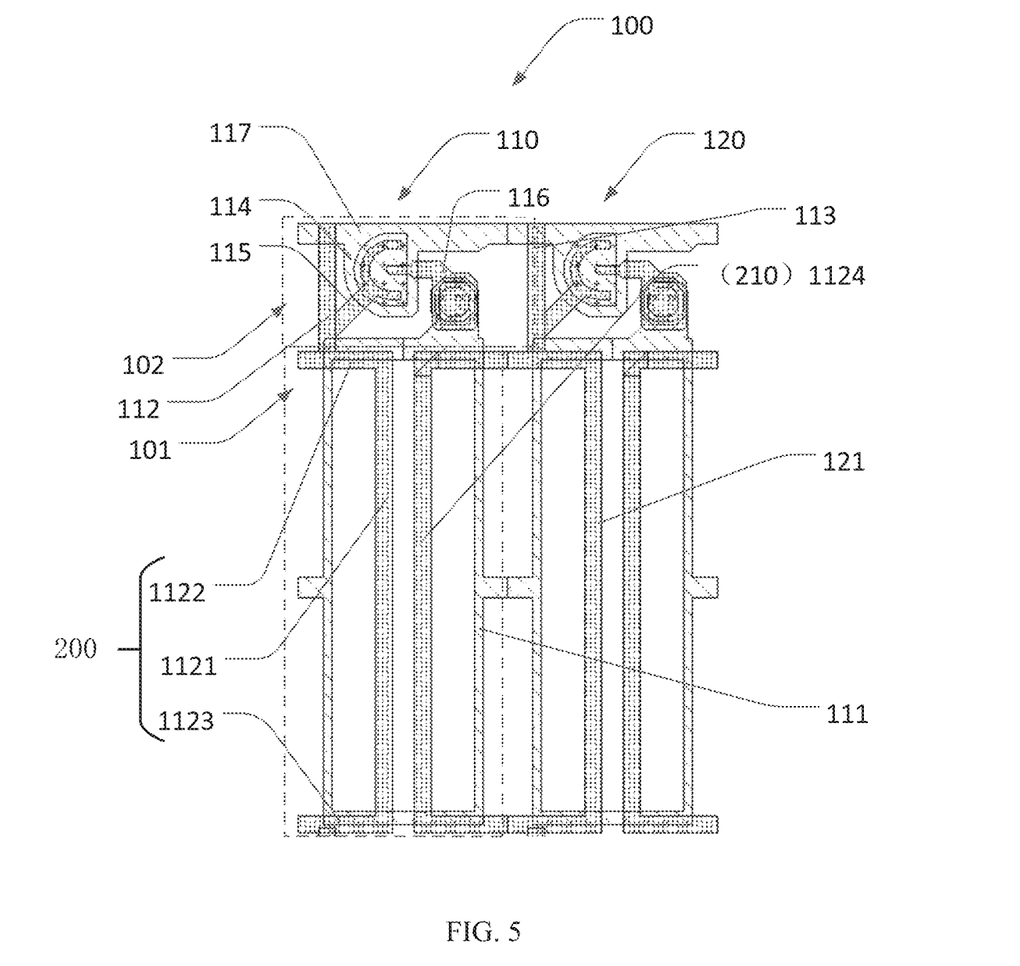
FIG. 5 is a schematic diagram of a pixel structure provided by an embodiment of the present invention.
Figure 6:
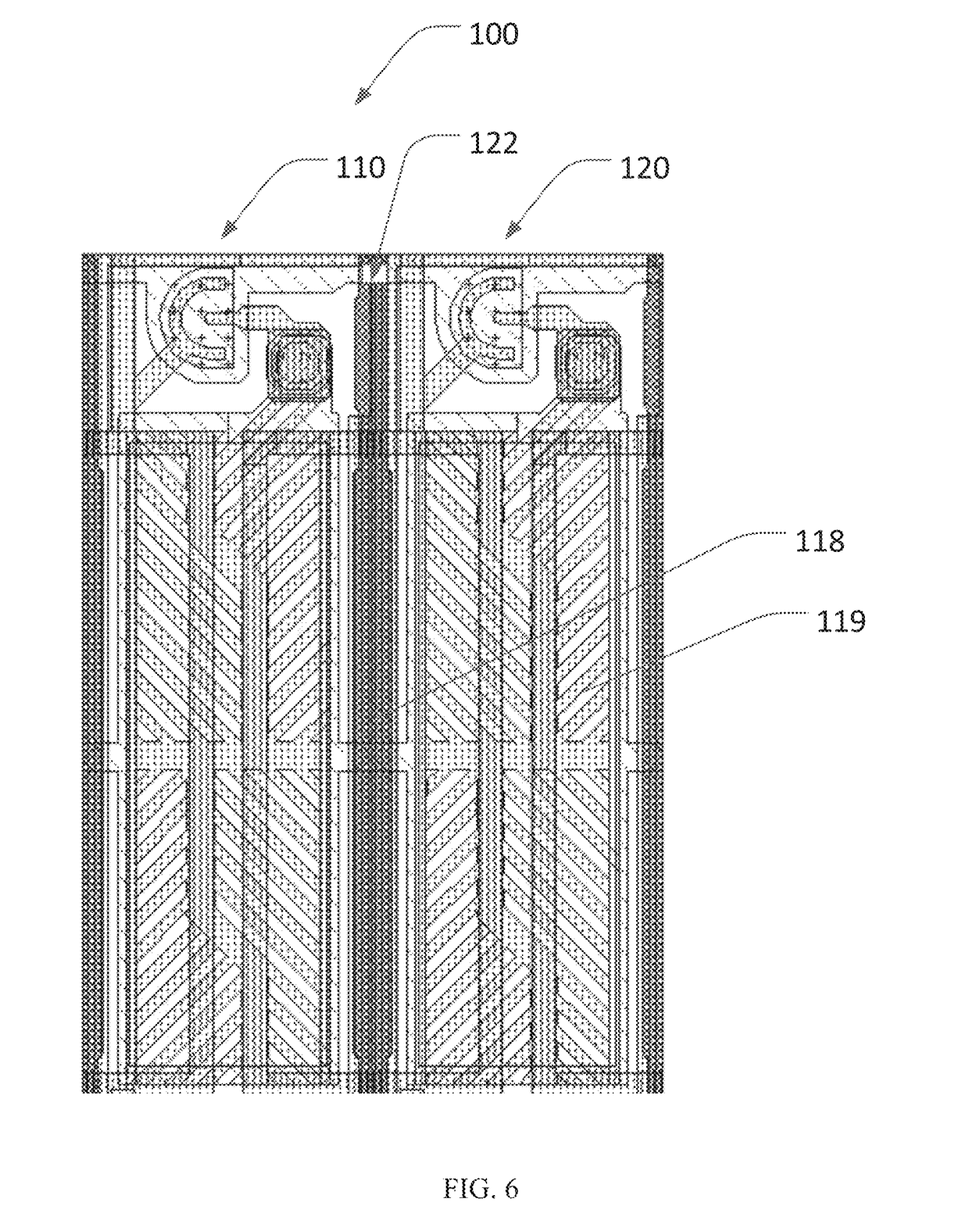
FIG. 6 is a schematic diagram of a pixel structure provided by another embodiment of the present invention.

As shown in FIG. 5 and FIG. 6, the present invention provides a display panel 100 including sub-pixel groups 100 arranged in an array.

The sub-pixel group 100 includes a first sub-pixel 110 and a second sub-pixel 120. The second sub-pixel 120 is provided on the left side of the first sub-pixel 110.

The first sub-pixel 110 includes: a common electrode wiring 111, a first data line 112, a second data line 1124, a horizontal scan line 117, a vertical scan line 118, and a pixel electrode 119.

The rectangle area enclosed by the common electrode wiring 111 serves as the display area 101 of the first sub-pixel 110. The common electrode wiring 111 and the horizontal scan line 117 are formed in the first metal layer 202 together. The first data line 112 and the second data line 1124 are formed in the second metal layer 204 together.

Specifically, when preparing the common electrode wiring 111 and the horizontal scan line 117, the common electrode wiring 111 and the horizontal scan line 117 are obtained by depositing a metal material followed by patterning. Materials of the common electrode wiring 111 and the horizontal scan line 117 include copper and/or its alloys.

When preparing the first data line 112 and the second data line 1124, the first data line 112 and the second data line 1124 are obtained by depositing a metal material followed by patterning. The materials of the first data line 112 and the second data line 1124 include copper and/or its alloys.

Figure 7:
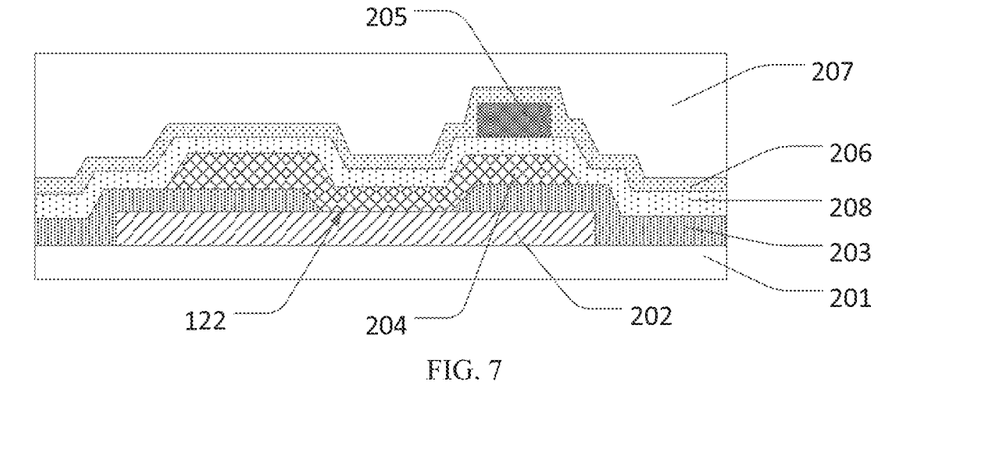
FIG. 7 is a cross-sectional view of the via hole in FIG. 6.

In a cross-sectional structure, as shown in FIG. 7, the second metal layer 204 is provided above the first metal layer 202, and the second metal layer 204 is provided on and insulated from the first metal layer 202.

In a cross-sectional structure, the first data line 112 is disposed above the common electrode wiring 111. In a planar structure, the first data line 112 extends from the non-display area 102 of the sub-pixel and passes through the display area 101.

In a cross-sectional structure, the second data line 1124 is arranged above the common electrode wiring 111. In a planar structure, the second data line 1124 extends from the non-display area 102 of the first sub-pixel 110 and passes through the display area 101.

The first data line 112 and the second data line 1124 are insulated from each other and do not intersect each other, and the first data line 112 and the second data line 1124 are arranged opposite to each other in the display area 101.

More specifically, the first data line 112 is arranged on a left side of a center line of the first sub-pixel 110, and the second data line 1124 is arranged on a right side of the center line of the first sub-pixel 110, such that the planar structural layout enables the first data line 112 and the second data line 1124 to be arranged opposite to each other in the display area 101.

In the present invention, the electrical signals of the first data line 112 and the second data line 1124 are set to be opposite to each other. Furthermore, the voltages generated when the first data line 112 and the second data line 1124 are coupled to the sub-pixel can be offset by each other, and finally the problem of vertical crosstalk of the ultra-narrow border can be improved.

The wiring portion of the first data line 112 in the display area 101 and the second data line 1124 are bilaterally symmetrical with respect to the center line of the first sub-pixel 110.

Specifically, the first data line 112 includes a trunk (not marked in the drawings. since the reference numeral 112 of the first data line has been marked, it can also be used as a trunk mark) and a first branch 200.

The trunk is provided in the non-display area 102.

The first branch 200 is disposed in the display area 101, and the first branch 200 is connected to the trunk.

The first branch 200 includes a vertical portion 1121 and two mutually parallel lateral portions (upper lateral portion 1122 and lower lateral portion 1123).

The upper lateral portion 1122 is connected to an upper end of the vertical portion 1121, and the lower lateral portion 1123 is connected to a lower end of the vertical portion 1121. The upper lateral portion 1122 corresponds to an upper boundary of the display area 101, and the lower lateral portion 1123 corresponds to a lower boundary of the display area 101. In other words, the upper lateral portion 1122 is correspondingly disposed on an upper short side of the rectangle area of the common electrode wiring 111, and the lower lateral portion 1123 is correspondingly disposed on a lower short side of the rectangle area of the common electrode wiring 111.

The second data line 1124 only includes a second branch 210. The second branch 210 has the same structure as the first branch 200. The second branch 210 also includes a vertical portion and two horizontal portions parallel to each other. The two horizontal portions are not marked in the drawings, and their details can be referred to the description for the structure of the second branch.

Specifically, the upper lateral portion of the second branch 210 is connected to the upper end of the vertical portion of the second branch 210, and the lower lateral portion of the second branch 210 is connected to the lower end of the vertical portion 1121. The upper lateral portion of the second branch 210 corresponds to the upper boundary of the display area 101, and the lower lateral portion of the second branch 210 corresponds to the lower boundary of the display area 101. In other words, the upper lateral portion of the second branch 210 is correspondingly disposed on an upper short side of the rectangle area of the common electrode wiring 111, and the lower lateral portion of the second branch 210 is correspondingly disposed on a lower short side of the rectangle area of the common electrode wiring 111.

The second branch 210 and the first branch 200 are bilaterally symmetrical with respect to the center line of the display area 101 of the first sub-pixel 110.

In the display area 101, the lateral portion of the first branch 200 and the lateral portion of the second branch 210 are correspondingly arranged on the same straight line. The vertical portion of the first branch 200 and the vertical portion of the second branch 210 are parallel to each other and are arranged on the left and right sides of the center line of the display area 101.

The opening direction of the pattern formed by the first branch 200 and the upper and lower lateral portions is opposite to the opening direction of the pattern formed by the second branch 210 and the upper and lower lateral portions.

The second sub-pixel 120 is an adjacent pixel of the first sub-pixel 110. The second sub-pixel 120 and the first sub-pixel 110 have the same structure. The present invention does not specifically limit the adjacent pixels, and the second sub-pixel 120 is arranged on the right side of the first sub-pixel 110 in this embodiment.

The first data line branch 121 of the second sub-pixel 120 and the second data line 1124 of the first sub-pixel 110 share a trunk (marked by the reference numeral 113).

In other words, the upper lateral portion of the first data line branch 121 of the second sub-pixel 120 and the upper lateral portion of the second branch 210 of the second data line 1124 merge at the trunk 113.

It can also be said that when the data line trunk passes through the non-display area 102 and reaches the upper boundary of the display area 101, the trunk 113 is divided into the first data line branch 121 of the second sub-pixel 120 and the second branch 210 of the second data line 1124, and when the two branches respectively extends to the lower boundaries of the display area 101 from the display area of different sub-pixels, they merge into a data line (trunk).

In summary, the present invention changes the wiring mode of the sub-pixel data lines, so that the non-display area 102 of the first sub-pixel 110 has a data line (the trunk of the first data line 112), and the first branch 200 of the first data line 112 is arranged in the display area 101. In addition, the display area 101 of the first sub-pixel 110 is further provided with a second data line 1124. The second branch of the second data line 1124 and the first data line branch 121 of the second sub-pixel 120 shares the trunk of the non-display area 102. Since the non-display area 102 only has one data line, the problem of narrow spacing between metals in the same layer of the structure can be avoided, and the number of the chips on film (COFs) used can be reduced, thereby reducing production costs.

In addition, by setting opposite signals of the first data line 112 and the second data line 1124, the coupling voltages of the two data line signals to the sub-pixels can be offset by each other, and the problem of vertical crosstalk of an ultra-narrow border display is improved. The present invention realizes the function of the pixel structure of FIG. 3.

The common electrode wiring of the second sub-pixel 120 is connected to the common electrode wiring 111 of the first sub-pixel 110, and the connection is set on a long side of the rectangle area, so as to realize the connection between the common electrode wirings of the first sub-pixel 110 and the second sub-pixel 120.

The lateral portions of the first data line 112 of the second sub-pixel 120 are respectively connected to the lateral portions of the second data line 1124 of the first sub-pixel 110. Therefore, the data lines is designed to have a pattern of a "mouth shape" in the present invention.

It can also be said that the present invention provides a data line trunk between the non-display area 102 of adjacent sub-pixels (the first sub-pixel 110 and the second sub-pixel 120), and when the data line (trunk) extends to the display area 101, it is divided into two branch structures, and the two branch structures enter different sub-pixels, respectively, wherein one of the two branch structures enters the first sub-pixel 110 and extends in the right area of the first sub-pixel 110, the other one of the two branch structures enters the second sub-pixel 120 and extends in the left area of the second sub-pixel 120, and finally the data line branches pass through the display area 101 and merge together at the lower boundary of the display area 101, thereby controlling the data signal of the sub-pixel in a next row.

The horizontal scan line 117 is disposed in the non-display area 102, and the trunk of the horizontal scan line 117 and the first data line 112 are perpendicular to each other.

From a perspective of FIG. 6, the vertical scan line 118 is provided between the first sub-pixel 110 and the second sub-pixel 120, and the vertical scan line 118 is connected to the horizontal scan line 117. The material of the vertical scan line 118 includes copper and/or its alloys.

In terms of a layered structure, the vertical scan line 118 and the horizontal scan line 117 are arranged in different layers.

The pixel electrode 119 is disposed above the display area 101 and made of a material including indium tin oxide.

The pixel electrode 119 includes an electrode trunk and a plurality of electrode branches arranged in parallel. The electrode branch pattern has a fishbone-like shape, and an angle between the electrode branch and the electrode trunk is generally set to 45 degrees.

The horizontal scan line 117 and the vertical scan line 118 are respectively formed in different metal layers, and the horizontal scan line 117 is connected to the vertical scan line 118 through a via hole 112. Furthermore, the problem of narrow spacing between metals in the same layer can be avoided.

In the present invention, the horizontal scan line 117 and the common electrode wiring 111 are prepared in the same layer. When preparing the common electrode wiring 111 and the horizontal scan line 117, a metal material is first deposited and then patterned to obtain the common electrode wiring 111 and the horizontal scan line 117.

The vertical scan line 118 and the data line can be arranged on the same layer, and can be obtained by depositing and patterning together during preparation. Therefore, the material of the vertical scan line 118 is the same as that of the data line.

As shown in FIG. 7, at the via hole 112, the cross-sectional structure of the sub-pixel includes: a substrate 201, a first metal layer 202, a first insulating layer 203, a second metal layer 204, a second insulating layer 208, a third metal layer 205, a passivation layer 206, and a color resist layer 207.

The substrate 201 is a flexible substrate, and made of polyimide.

The first metal layer 202 is disposed on the substrate 201. The material of the first metal layer 202 includes copper and/or its alloys. The gate of the thin film transistor is formed in the first metal layer 202.

The first insulating layer 203 is disposed on the substrate 201 and covers the first metal layer 202, and the first insulating layer 203 includes the via hole 112. The material of the first insulating layer 203 includes silicon nitride or silicon oxide.

The second metal layer 204 is disposed on the first insulating layer 203, and the second metal layer 204 is connected to the first metal layer 202 through the via hole 112. The material of the second metal layer 204 includes copper and/or its alloys.

The second insulating layer 208 is disposed on the second metal layer 204 and the first insulating layer 203. The material of the second insulating layer 208 includes silicon nitride or silicon oxide.

The third metal layer 205 is disposed on the second insulating layer 208. The material of the third metal layer 205 includes copper and/or its alloys.

The first data line 112 and the second data line 1124 are prepared in the third metal layer 205 by vapor deposition.

The passivation layer 206 is disposed on the second insulating layer 205 and covers the third metal layer 205. The material of the passivation layer 206 includes silicon nitride or silicon oxide.

The color resist layer 207 is disposed on the passivation layer 206, and the color resist layer 207 includes a red color resist (R), a blue color resist (B), and a green color resist (G).

In an embodiment, the common electrode wiring 111 and the horizontal scan line 117 are provided in the first metal layer 202; and the vertical scan line 118 is provided in the second metal layer 204.

In an embodiment, the common electrode wiring 111 and the horizontal scan line 117 may be provided in the second metal layer 204; and the vertical scan line 118 is provided in the first metal layer 202.

The present invention can avoid the problem of narrow pacing between metals in the same layer by arranging metal wirings in different layers.

Figure 8:
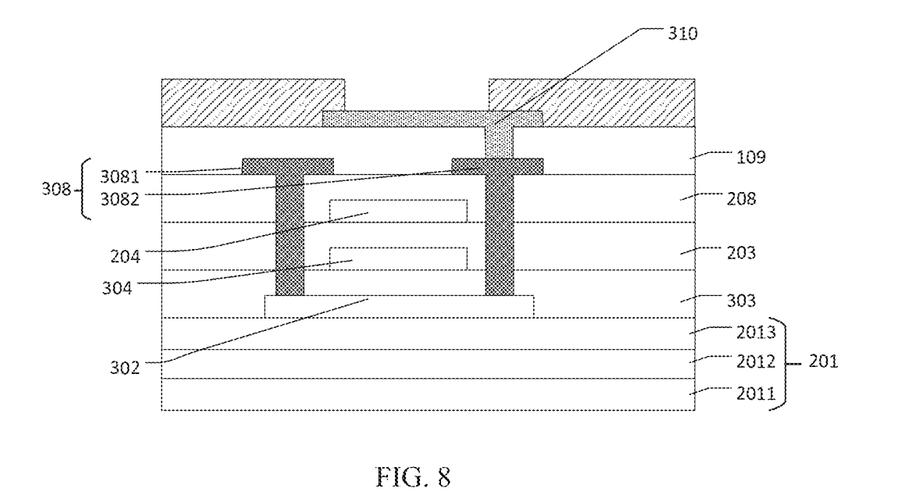
FIG. 8 is a schematic structural diagram of a thin film transistor provided by an embodiment of the present invention.

In an embodiment, the first sub-pixel 110 further includes: a thin film transistor.

As shown in FIG. 8, the thin film transistor is disposed in the non-display area 102, wherein the layered structure at the thin film transistor specifically includes: a substrate 201, an active layer 302, a gate insulating layer 303, a gate 304, a first insulating layer 203, a second metal layer 204, a second insulating layer 208, a source/drain metal layer 308, a passivation layer 206, and a first electrode layer 310. Some of the layers in FIG. 8 are the same as those in FIG. 7.

The substrate 201 includes a glass substrate 2011, a barrier layer 2012, and a buffer layer 2013.

The barrier layer 2012 is provided on the glass substrate 2011; and the buffer layer 2013 is provided on a side of the barrier layer 2012 away from the glass substrate 2011. The material of the barrier layer 2012 includes silicon nitride and/or silicon oxide.

The active layer 302 is disposed on the substrate 201; and the active layer 302 is made of polysilicon material.

The gate insulating layer 303 is disposed on the active layer 302 and the substrate 201.

The gate 304 is disposed on the gate insulating layer 303; and the material of the gate 304 includes aluminum, copper, and/or copper-aluminum alloy. That is, the material of the gate 304 may be selected from aluminum, copper, or copper aluminum alloy.

Among them, aluminum has the best electrical conductivity, and aluminum and copper have better flexibility, which are suitable for preparing the flexible display panel 100.

The grid 304 of the display panel 100 of the present invention is made of copper-aluminum alloy, whose conductivity and bending resistance are far superior to molybdenum used for the existing gate material, and can be well suited for foldable display panels or curlable display panels.

The gate 304 is prepared in the first metal layer 202, and can be prepared together with the common electrode wiring 111 and the horizontal scan line 117 by vapor deposition.

The first insulating layer 203 is disposed on the gate 304 and the gate insulating layer 303.

The second metal layer 204 is disposed on the first insulating layer 203.

The second insulating layer 208 is disposed on the second metal layer 204 and the first insulating layer 203.

The source/drain metal layer 308 is disposed on the second insulating layer 208 and connected to the active layer 302; the source/drain metal layer 308 has a source wiring 3081 and a drain wiring 3082. The source wiring 3081 and the drain wiring 3082 are respectively connected to the active layer 302. The source/drain metal layers 308 are prepared in the third metal layer 205 by vapor deposition.

The passivation layer 206 is provided on the source/drain metal layer 308 and the second insulating layer 208; the first electrode layer 310 is provided on the passivation layer 206; and the first electrode layer 310 is patterned to obtain the pixel electrode 119

The present invention changes the wiring mode of the sub-pixel data lines, so that the non-display area 102 of the first sub-pixel 110 only has a trunk of the first data line 112, and the first branch 200 of the first data line 112 is arranged in the display area 101. In addition, the display area 101 of the first sub-pixel 110 is further provided with a second data line 1124. In the present invention, by setting opposite signals of the first data line 112 and the second data line 1124, the coupling voltages of the two data line signals to the sub-pixels can be offset by each other, and the problem of vertical crosstalk of an ultra-narrow border display is improved.

In one of the sub-pixel groups, the second branch 210 of the second data line 1124 and the first data line branch 121 of the second sub-pixel 120 share the trunk of the non-display area 102. While the present invention realizes the function of the pixel structure in FIG. 3, since there is only one data line in the non-display area 102, the number of COFs can be reduced and the production cost can be reduced.

In the present invention, the horizontal scan line 117 and the vertical scan line 118 are arranged in different layers, which can avoid the problem of the narrow spacing between metals in the same layer of the structure.

The present invention also provides a display device, which includes the display panel 100 of the present invention.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising a plurality of sub-pixel groups disposed in an array, wherein each of the sub-pixel groups comprises a first sub-pixel; and
the first sub-pixel comprises:
a common electrode wiring enclosing a rectangle area to serve as a display area of the first sub-pixel;
a first data line disposed above the common electrode wiring, wherein the first data line extends from a non-display area of the first sub-pixel and passes through the display area; and
a second data line disposed above the common electrode wiring, wherein the second data line is disposed in the display area of the first sub-pixel and opposite to the first data line,
wherein, the first data line and the second data line are insulated from each other and do not intersect each other, and electrical signals of the first data line and the second data line are opposite.

2. The display panel according to claim 1, wherein the first data line and the second data line in the display area are bilaterally symmetrical with respect to a center line of the first sub-pixel.

3. The display panel according to claim 1, wherein
the first data line comprises a trunk disposed in the non-display area and a first branch disposed in the display area, and the first branch is connected to the trunk; and
the second data line comprises a second branch disposed in the display area, and the second branch and the first branch are bilaterally symmetrical with respect to a center line of the first sub-pixel.

4. The display panel according to claim 3, wherein each of the first branch and the second branch comprises:
a vertical portion;
an upper horizontal portion connected to one end of the vertical portion; and
a lower horizontal portion connected to an opposite end of the vertical portion.

5. The display panel according to claim 4, wherein each of the sub-pixel groups further comprises a second sub-pixel, the second sub-pixel is a sub-pixel in a row adjacent to the first sub-pixel, and
the second sub-pixel has a same structure as the first sub-pixel.

6. The display panel according to claim 5, wherein the first data line of the second sub-pixel and the second data line of the first sub-pixel share one trunk.

7. The display panel according to claim 5, wherein
a lateral portion of the first data line of the second sub-pixel and a lateral portion of the second data line of the first sub-pixel are connected to the trunk of the first data line of the second sub-pixel.

8. The display panel according to claim 5, further comprising:
a horizontal scan line disposed in the non-display area;
a vertical scan line disposed between the first sub-pixel and the second sub-pixel and connected to the horizontal scan line; and
a pixel electrode disposed above the display area.

9. The display panel according to claim 8, wherein
the horizontal scan line is formed in a first metal layer;
the vertical scan line is formed in a second metal layer, and the second metal layer is insulated from the first metal layer; and
the horizontal scan line is connected to the vertical scan line through a via hole.

10. The display panel according to claim 1, further comprising a plurality of thin film transistors disposed in the non-display area,
wherein each of the thin film transistors comprises:
a gate; and
a source and a drain disposed above the gate.

11. A display device, comprising a display panel, the display panel comprising a plurality of sub-pixel groups disposed in an array, wherein
each of the sub-pixel groups comprises a first sub-pixel; and
the first sub-pixel comprises:
a common electrode wiring enclosing a rectangle area to serve as a display area of the first sub-pixel;
a first data line disposed above the common electrode wiring, wherein the first data line extends from a non-display area of the first sub-pixel and passes through the display area; and a second data line disposed above the common electrode wiring, wherein the second data line is disposed in the display area of the first sub-pixel and opposite to the first data line, wherein, the first data line and the second data line are insulated from each other and do not intersect each other, and electrical signals of the first data line and the second data line are opposite.

12. The display device according to claim 11, wherein the first data line and the second data line in the display area are bilaterally symmetrical with respect to a center line of the first sub-pixel.

13. The display device according to claim 11, wherein
the first data line comprises a trunk disposed in the non-display area and a first branch disposed in the display area, and the first branch is connected to the trunk; and
the second data line comprises a second branch disposed in the display area, and the second branch and the first branch are bilaterally symmetrical with respect to a center line of the first sub-pixel.

14. The display device according to claim 13, wherein each of the first branch and the second branch comprises:
a vertical portion;
an upper horizontal portion connected to one end of the vertical portion; and
a lower horizontal portion connected to an opposite end of the vertical portion.

15. The display device according to claim 14, wherein each of the sub-pixel groups further comprises a second sub-pixel, the second sub-pixel is a sub-pixel in a row adjacent to the first sub-pixel, and the second sub-pixel has a same structure as the first sub-pixel.

16. The display device according to claim 15, wherein the first data line of the second sub-pixel and the second data line of the first sub-pixel share one trunk.

17. The display device according to claim 15, wherein
a lateral portion of the first data line of the second sub-pixel and a lateral portion of the second data line of the first sub-pixel are connected to the trunk of the first data line of the second sub-pixel.

18. The display device according to claim 15, further comprising:
a horizontal scan line disposed in the non-display area;
a vertical scan line disposed between the first sub-pixel and the second sub-pixel and connected to the horizontal scan line; and
a pixel electrode disposed above the display area.

19. The display device according to claim 18, wherein
the horizontal scan line is formed in a first metal layer;
the vertical scan line is formed in a second metal layer, and the second metal layer is insulated from the first metal layer; and
the horizontal scan line is connected to the vertical scan line through a via hole.

20. The display device according to claim 11, further comprising a plurality of thin film transistors disposed in the non-display area,
wherein each of the thin film transistors comprises:
a gate; and
a source and a drain disposed above the gate.

* * * * *